US006867982B2

United States Patent
Ito et al.

(10) Patent No.: US 6,867,982 B2
(45) Date of Patent: Mar. 15, 2005

(54) HIGH FREQUENCY COMPONENT AND COMMUNICATION APPARATUS INCORPORATING THE SAME

(75) Inventors: Tomonori Ito, Shiga-ken (JP); Norio Yoshida, Otsu (JP); Takahiro Watanabe, Shiga-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/795,519

(22) Filed: Feb. 28, 2001

(65) Prior Publication Data
US 2001/0026953 A1 Oct. 4, 2001

(30) Foreign Application Priority Data
Feb. 29, 2000 (JP) ........................................ 2000-053314

(51) Int. Cl.[7] ................................................. H05K 5/06
(52) U.S. Cl. ....................... 361/752; 361/800; 361/816; 361/818; 174/35 R; 174/51
(58) Field of Search ................................ 361/752, 818, 361/800, 816, 724, 714, 979, 796, 797; 174/35 R, 51; 385/135; 156/256, 252; 428/901

(56) References Cited

U.S. PATENT DOCUMENTS

| 3,090,907 A | * | 5/1963 | Maeda ........................ 323/355 |
| 3,831,066 A | * | 8/1974 | Gabrail ........................ 148/249 |
| 4,707,722 A | | 11/1987 | Folk et al. |
| 5,039,974 A | | 8/1991 | Schaefer |
| 5,422,433 A | | 6/1995 | Rivera et al. |
| 5,783,978 A | | 7/1998 | Noguchi et al. |
| 6,136,131 A | * | 10/2000 | Sosnowski ................... 156/256 |
| 6,239,753 B1 | * | 5/2001 | Kado et al. ................... 343/702 |

FOREIGN PATENT DOCUMENTS

| JP | 52-117242 | | 3/1976 |
| JP | 9-191206 | * | 7/1997 |
| JP | 11-224911 | | 8/1999 |

* cited by examiner

Primary Examiner—Kamand Cuneo
Assistant Examiner—Hung S. Bui
(74) Attorney, Agent, or Firm—Keating & Bennett, LLP

(57) ABSTRACT

A high frequency component minimizes changes in the inductance of a chip coil mounted on a substrate such that stable characteristics are obtained. In the high frequency component, chip components including the chip coil are mounted on the substrate. A hole is provided in a portion of a metal cover positioned above the chip coil when the metal cover covers the top portion of the substrate.

13 Claims, 4 Drawing Sheets

HIGH FREQUENCY COMPONENT AND COMMUNICATION APPARATUS INCORPORATING THE SAME

BACKGROUND OF THE INVENTION

1. Field of the Invention

The present invention relates to high frequency components having metal covers attached thereto and communication apparatuses including such high frequency components.

2. Description of the Related Art

In a conventional high frequency component, such as a voltage-controlled oscillator (VCO) and a PLL module used in a mobile phone and other communications devices, various kinds of chip components are mounted on a substrate having an electrode pattern provided thereon. In addition, a metal cover is attached to the substrate to cover the top of the substrate including the chip components.

Each of FIGS. 7A and 7B shows such a conventional high frequency component. FIG. 7A shows a perspective view of the high frequency component and FIG. 7B shows a sectional view thereof. In these figures, the reference numeral 1 denotes a ceramic substrate, on which various types of chip components including a chip coil 3 are mounted. A metal cover 2 is fitted over the top of the substrate 1 to cover the top of the substrate 1, on which the chip components are mounted.

In the conventional high frequency component in which the top of the substrate 1 having the chip components mounted thereon is covered with the metal cover 2, the metal cover 2 is in close proximity to the components mounted on the substrate, particularly, in close proximity to the chip coil 3. As a result, the inductance of the chip coil is substantially reduced. In addition, when the attachment position of the metal cover 2 on the substrate 1 changes due to positional inaccuracy in mounting the chip coil 3 on the substrate 1 and dimensional inaccuracy of the metal cover 2, the inductance of the chip coil 3 varies.

As a result, the above-described problems affect the characteristics of high frequency components, such as a VCO and a PLL module. The characteristics thereof deviate from a desired characteristic range, thereby reducing the ratio of non-defective products to defective products.

SUMMARY OF THE INVENTION

To overcome the above-described problems with the prior art, preferred embodiments of the present invention provide a high frequency component which minimizes changes in the inductance of a chip coil mounted on a substrate to achieve very stable characteristics. Another preferred embodiment of the present invention provides a communication apparatus incorporating such a novel high frequency component.

According to a first preferred embodiment of the present invention, a high frequency component is provided which includes a substrate, high frequency circuit components including a chip coil mounted on the substrate, a metal cover for covering the top of the substrate, and a hole provided in a portion of the metal cover in the vicinity of the chip coil.

In this arrangement, the distance between the chip coil and the metal cover is greatly increased such that coupling between the chip coil and the metal cover is greatly reduced. This greatly reduces influences occurring when the metal cover is positioned close to the chip coil. In addition, this arrangement also reduces changes in the inductance of the chip coil associated with changes in the distance between the chip coil and the metal cover.

Furthermore, the diameter or width of the hole may be greater than the diameter or width of the chip coil or may be equal to or less than a length corresponding to about ¼ wavelength of a frequency used in the component. With this arrangement, the radiation and incidence of electromagnetic waves of frequency bands that is substantially equal to or higher than the used frequency band are sufficiently suppressed. As a result, the shielding effect of the metal cover is maintained.

In addition, in this high frequency component, an inner surface of the metal cover is solder-plated and an outer surface thereof is nickel-plated.

According to a second preferred embodiment of the present invention, a communication apparatus incorporating the high frequency component having the above-described structure is provided. For example, the high frequency component is provided as an oscillator or a filter for high frequency signals.

Other features, elements, advantages and characteristics of the present invention will become more apparent from the detailed description of preferred embodiments thereof with reference to the attached drawings.

DETAILED DESCRIPTION OF PREFERRED EMBODIMENTS

A description will be given of the structure of a PLL module as a high frequency component according to a first preferred embodiment of the present invention with reference to FIGS. 1A and 1B to FIG. 3.

Figure 1A:
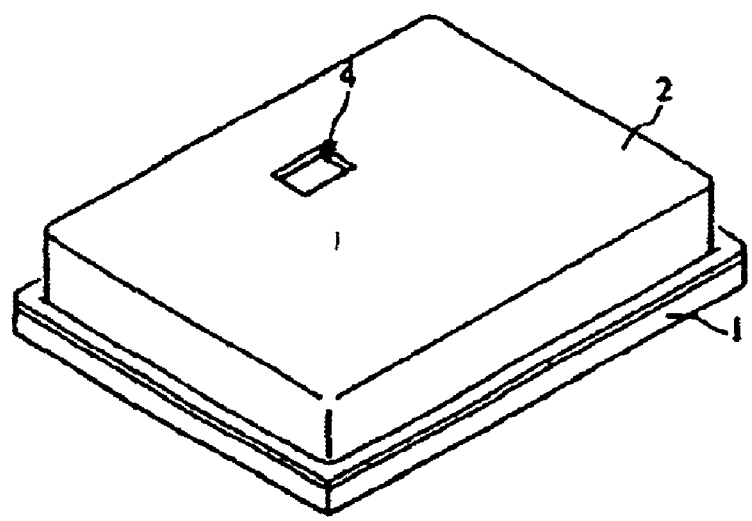
FIGS. 1A and 1B show a perspective view and a sectional view of a high frequency component according to a first preferred embodiment of the present invention.
Figure 1B:
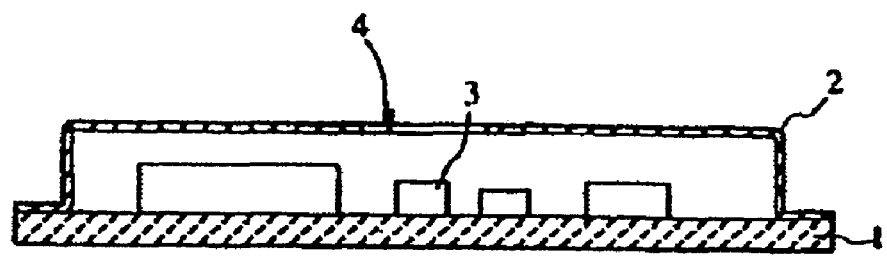

FIG. 1A shows a perspective view of a PLL module, and FIG. 1B shows a sectional view thereof. In this PLL module, an electrode pattern is provided on an upper surface of a ceramic substrate 1, and chip components including a chip coil 3 are mounted thereon. In a portion of a metal cover 2, a hole 4 is provided near the chip coil 3.

Figure 2A:
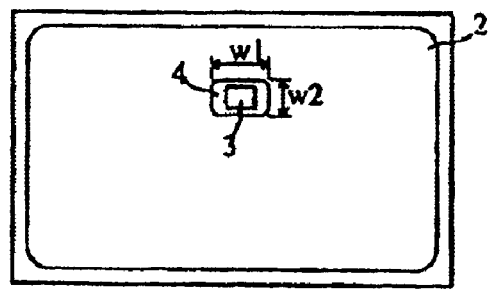
FIGS. 2A and 2B show top views of the high frequency component.
Figure 2B:
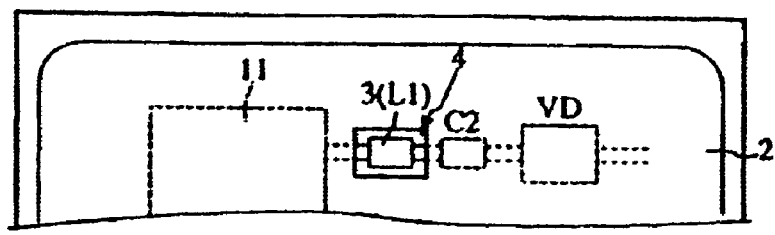

FIG. 2A shows a top view of the PLL module, and FIG. 2B shows a partially enlarged view thereof. The widths w1 and w2 of the hole 4 are greater than the widths of the chip coil 3, and are substantially equal to or less than about ¼ wavelength of a frequency utilized in the component.

In these figures, the widths of the chip coil 3 are preferably about 1.0 mm×about 0.5 mm. The width w1 is preferably greater than about 1.0 mm, and the width w2 is preferably greater than about 0.5 mm. In addition, both w1 and w2 are less than a length of about 31 mm corresponding to about ¼ wavelength of a used frequency of 2.4 GHz.

Figure 3:
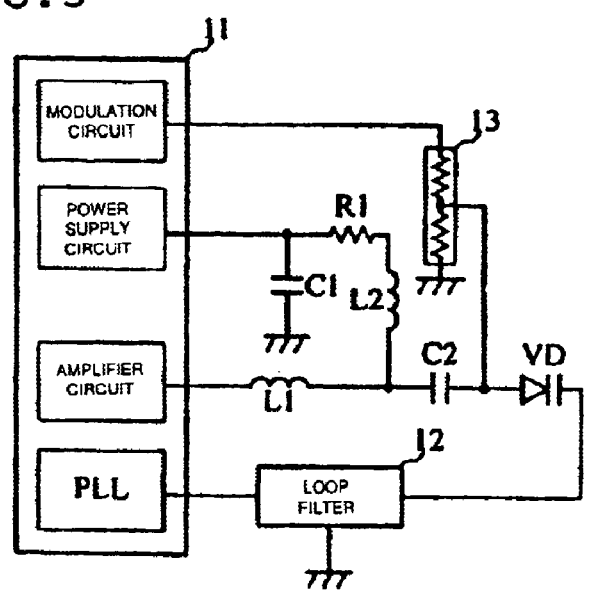
FIG. 3 shows a circuit diagram of the main portion of the high frequency component.

FIG. 3 shows a circuit diagram of the main portion of the above PLL module. The reference numeral 11 denotes a high frequency integrated circuit (IC). An amplifier circuit included in the high frequency IC and a resonance circuit including a chip inductor L1, a chip capacitor C2, and a varactor diode VD defines a voltage-controlled oscillation circuit (VCO). A loop filter 12 is provided at the output end of a PLL circuit included in the high frequency IC 11. The output end of the loop filter 12 is connected to the cathode of a varactor diode VD. The output end of a modulation circuit included in the high frequency IC 11 is connected to the anode of the varactor diode VD via a resistance voltage divider 13 which divides voltage by resistor. In addition, a voltage of a power supply circuit included in the high frequency IC 11 is connected to the chip inductor L1 via a capacitor C1, a resistor R1 and a choke coil L2. Via this arrangement, a power supply voltage is supplied to the amplifier circuit.

The above PLL circuit performs a phase comparison between a reference frequency signal supplied from the outside and an oscillation signal of the oscillation circuit, and sends a phase error signal to the varactor diode VD via the loop filter 12. With this arrangement, the capacitance of the varactor diode VD is changed such that the oscillation frequency is controlled. Furthermore, the modulation circuit controls a voltage applied to the varactor diode VD to modulate the oscillation frequency.

The reference numerals 11, L1, C2, and the reference character VD shown in FIGS. 2A and 2B correspond to the high frequency IC 11, the chip inductor L1, the chip capacitor C2, the varactor diode VD shown in FIG. 3.

As shown here, the hole 4 of the metal cover 2 is positioned near the chip coil 3 (L1). This arrangement suppresses electromagnetic coupling between the chip coil 3 and the metal cover 2. Thus, only a minimal change in the inductance of the chip coil 3 occurs before and after covering with the metal cover 2. As a result, before covering the top portion of the substrate 1 with the metal cover 2, only the characteristics of the PLL module must be measured and adjusted. In addition, the characteristics of the PLL module do not change after the metal cover 2 is provided thereon.

Furthermore, the widths of the hole 4 provided in the metal cover 2 are greater than the widths of the chip coil 3. Thus, if a slight deviation occurs between the position of the chip coil 3 and the position of the hole 4 of the metal cover 2, the inductance of the chip coil 3 does not substantially change when the metal cover 2 is in close proximity to the chip coil 3. Thus, regardless of the dimensional accuracy of a position for mounting the chip coil 3 on the substrate 1, the accuracy of fitting the metal cover 2 over the substrate 1, and the dimensional accuracy of the metal cover 2, the inductance of the chip coil 3 has a desired value such that the PLL module has stable characteristics.

Furthermore, the widths of the hole 4 provided in the metal cover 2 are substantially equal to or less than about ¼ wavelength of the used frequency. Thus, unnecessary radiation of electromagnetic waves in the used frequency band and a higher frequency band to the outside and the incidence thereof from the outside to the inside is suppressed. As a result, the shielding effect of the metal cover 2 is maintained.

Figure 4:
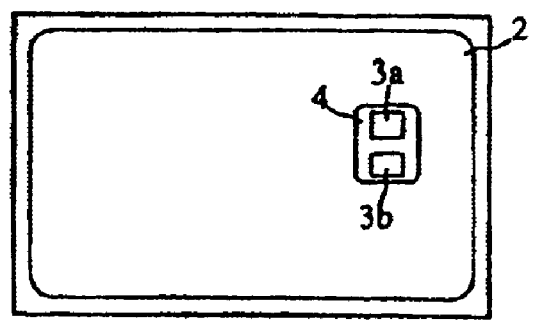
FIG. 4 shows a top view of a high frequency component according to a second preferred embodiment of the present invention.

FIG. 4 shows a high frequency component according to a second preferred embodiment of the present invention. FIG. 4 shows the top view of the high frequency component. As is clear from a comparison with the preferred embodiment shown in FIGS. 2A and 2B, in this preferred embodiment, chip coils 3a and 3b are arranged close to each other on a substrate. A metal cover 2 includes a hole 4 shared by the two chip coils 3a and 3b. With this arrangement, similarly, coupling between the metal cover 2 and the chip coils 3a and 3b are suppressed. As a result, the same advantages as those in the first preferred embodiment can be obtained. In addition, in this preferred embodiment, since only a single hole 4 is provided in the metal cover 2, the metal cover 2 is easily produced.

In the preferred embodiments, the hole 4 is preferably rectangular shaped. However, the hole 4 may be a round hole having a diameter which is greater than the widths of the chip coil 3 and is less than a length corresponding to about ¼ wavelength of a used frequency.

Figure 5:
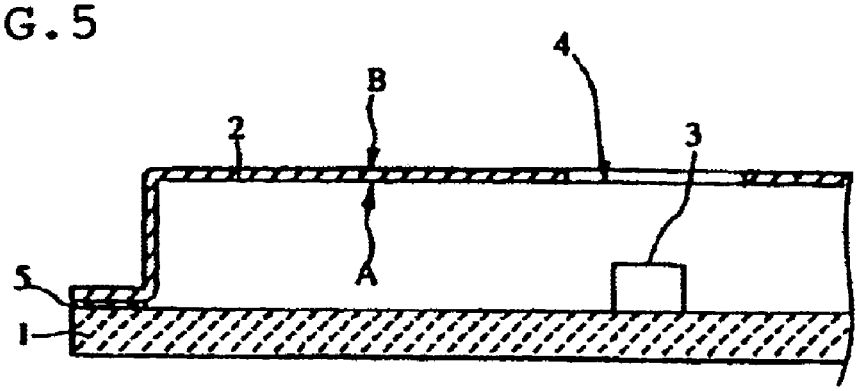
FIG. 5 shows a partial sectional view of a high frequency component according to a third preferred embodiment of the present invention.

Next, FIG. 5 shows a partial section of a high frequency component according to a third preferred embodiment of the present invention. In this preferred embodiment, an inner surface A of a metal cover 2 is preferably solder-plated, and an outer surface B thereof is nickel-plated. Such a metal cover is formed as follows. That is, a metal plate is provided in which one surface of the metal plate is nickel-plated and the other surface thereof is solder-plated. Then, the metal plate is stamped out or compressed to produce a cover.

When the metal cover 2 is attached to the top of the substrate 1, the inner surfaces of peripheral portions of the metal cover 2 are soldered with an electrode pad 5 on the substrate.

As mentioned above, when the inner surface of the metal cover 2 is solder-plated, the soldered-surface wettability sufficient to maintain the strength to attach the metal cover 2 to the substrate 1. In addition, since the outer surface of the metal cover 2 is nickel-plated, the metal cover 2 is brighter, and thus laser marking can be performed.

Figure 6:
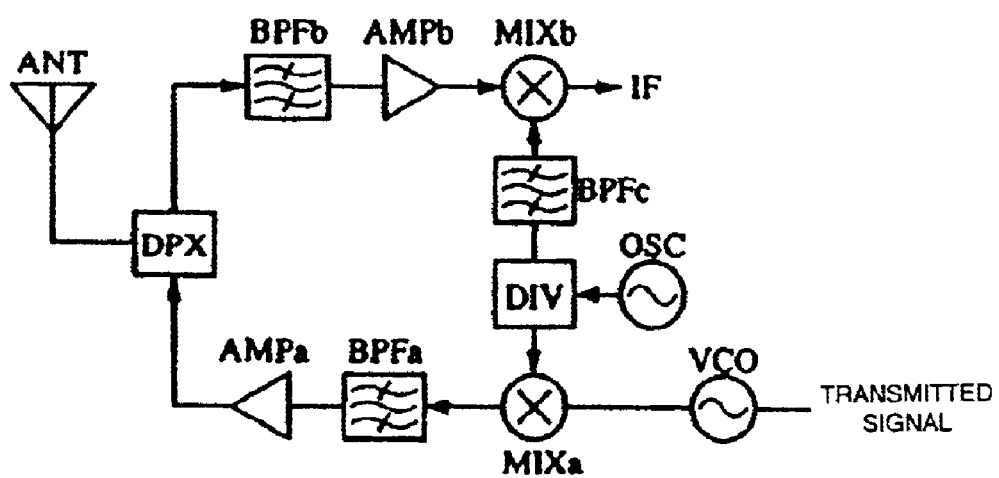
FIG. 6 shows a block diagram of a communication apparatus according to a fourth preferred embodiment of the present invention.
Figure 7A:
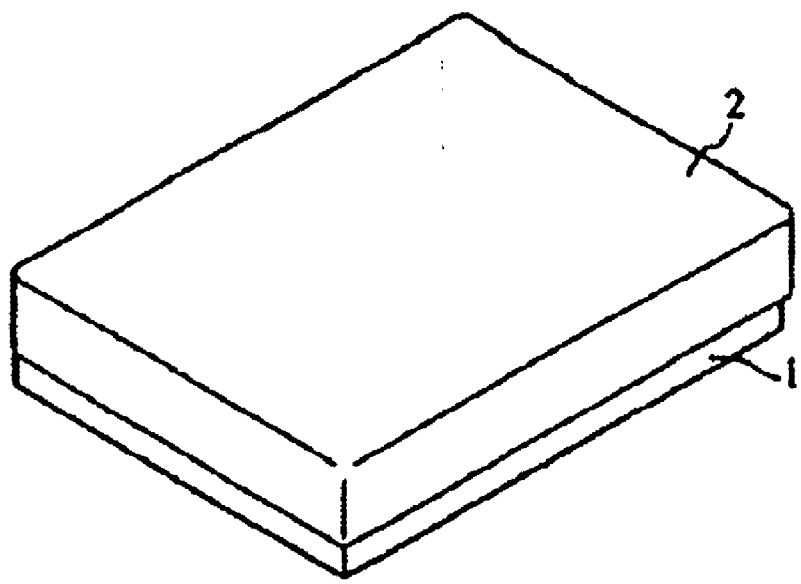
FIGS. 7A and 7B show a perspective view and a sectional view for illustrating the structure of a conventional high frequency component.
Figure 7B:
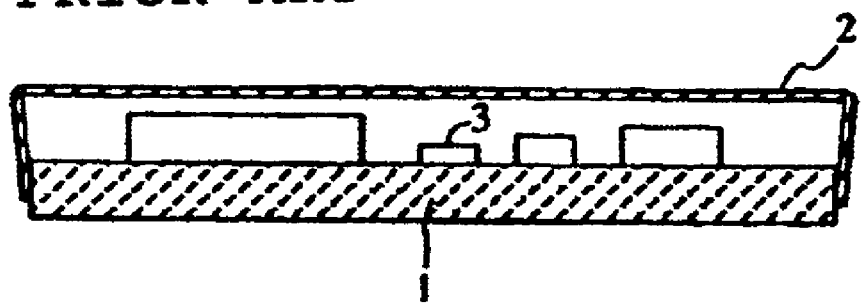

Next, a description will be provided of the structure of a communication apparatus according to a fourth preferred embodiment of the present invention with reference to FIG. 6. In this figure, the reference character ANT denotes a transmission/reception antenna, the reference character DPX denotes a duplexer, the reference characters BPFa, BPFb, and BPFc denote band pass filters, and the reference characters AMPa and AMPb denote amplifier circuits. The reference characters MIXa and MIXb denote mixers, the reference character OSC denotes an oscillator, and the reference character DIV denotes a frequency divider (synthesizer). The reference character VCO denotes a voltage-controlled oscillator modulating an oscillation frequency with a signal according to transmitted signal (transmitted data).

The MIXa modulates a frequency signal output from the DIV with a modulation signal. The BPFa passes only signals of a transmitted frequency band, and the AMPa performs power-amplification of the signals to transmit from the ANT via the DPX. The BPFb passes only signals of a received frequency band among signals output from the DPX, and the AMPb amplifies the signals. The MIXb mixes a frequency signal output from the BPFc and a received signal to output an intermediate frequency signal IF.

High frequency components shown in FIGS. 1A and 1B to 5 are preferably used as a high frequency component using a chip coil, such as the VCO and the filters shown in FIG. 6. As a result, a communication apparatus is provided incorporating a high frequency component having very stable characteristics.

As described above, according to preferred embodiments of the present invention, a chip coil is not influenced by a metal cover positioned close to the chip coil. Thus, the chip coil can be used as a device having a desired inductance. Furthermore, changes in the inductance of the chip coil with respect to changes in the distance between the chip coil and the metal cover are greatly reduced.

In addition, the radiation and incidence of electromagnetic waves in a frequency band that is substantially equal to or higher than a used frequency band through the hole provided in the metal cover is sufficiently suppressed. As a result, stable characteristics and operations are achieved.

In addition, the attach strength of the metal cover to the electrode pad on the substrate is greatly increased. Furthermore, the appearance of the high frequency component is improved. Additionally, with laser marking, the product number is easily provided on the metal cover.

According to other preferred embodiments of the invention, the high frequency component having desired characteristics and operating in a stable manner is used to provide the high frequency circuit section including the filter, the oscillator, and other suitable components, for use with high frequency signals. Thus, a communication apparatus having desired communication capabilities is achieved.

While preferred embodiments of the present invention have been illustrated and described, it would be obvious to those skilled in the art that various other changes and modifications can be made without departing from the spirit and scope of the invention as hereinafter claimed.

What is claimed is:

1. A high frequency component comprising:
  a substrate;
  high frequency circuit components including a chip coil mounted on the substrate;
  a metal cover for covering the top of the substrate; and
  a hole provided in a portion of the metal cover in the vicinity of the at least one chip coil such that the hole is disposed directly above the at least one chip coil; wherein
  the diameter or width and length dimensions of the hole are greater than the diameter or width and length dimensions of the at least one chip coil and are substantially equal to or less than a length equal to about ¼ wavelength of a frequency used by the high frequency component.

2. A high frequency component according to claim 1, wherein an inner surface of the metal cover is solder-plated and an outer surface thereof is nickel-plated.

3. A high frequency component according to claim 1, wherein the high frequency component is a PLL module.

4. A high frequency component according to claim 1, wherein the hole is substantially round.

5. A communication apparatus comprising the high frequency component according to claim 1.

6. A high frequency component comprising:
  a substrate;
  high frequency circuit components including at least one chip coil mounted on the substrate;
  a metal cover for covering the top of the substrate; and
  a hole provided in a portion of the metal cover in the vicinity of the at least one chip coil such that the hole is disposed directly above the at least one chip coil; wherein
  the diameter or width and length dimensions of the hole are equal to or less than a length equal to about ¼ wavelength of a frequency used by the high frequency component.

7. A high frequency component according to claim 6, wherein said at least one chip coil includes two chip coils.

8. A high frequency component according to claim 7, wherein an inner surface of the metal cover is solder-plated and an outer surface thereof is nickel-plated.

9. A high frequency component according to claim 6, wherein the hole is in the vicinity of both of said two chip coils.

10. A high frequency component according to claim 6, wherein an inner surface of the metal cover is solder-plated and an outer surface thereof is nickel-plated.

11. A high frequency component according to claim 6, wherein the high frequency component is a PLL module.

12. A high frequency component according to claim 6, wherein the hole is substantially round.

13. A communication apparatus comprising the high frequency component according to claim 6.

* * * * *